United States Patent [19]

Cook et al.

[11] Patent Number: 5,235,216
[45] Date of Patent: Aug. 10, 1993

[54] BIPOLAR TRANSISTOR USING EMITTER-BASE REVERSE BIAS CARRIER GENERATION

[75] Inventors: Robert K. Cook, Poughkeepsie; Bob H. Yun, Hopewell Junction, both of N.Y.

[73] Assignee: International Business Machines Corporation, Armonk, N.Y.

[21] Appl. No.: 729,969

[22] Filed: Jul. 15, 1991

[51] Int. Cl.$^5$ ............................................. H01L 29/72
[52] U.S. Cl. ..................................... 307/302; 257/589
[58] Field of Search ........................... 357/33, 34, 13; 307/302, 318; 257/589

[56] References Cited

U.S. PATENT DOCUMENTS

| | | | |
|---|---|---|---|
| 3,571,630 | 3/1971 | Widlar | 307/302 |
| 4,127,860 | 11/1978 | Beelitz et al. | 357/15 |
| 4,131,902 | 12/1978 | Kub | 357/6 |
| 4,163,245 | 7/1979 | Kinoshita | 357/51 |
| 4,326,208 | 4/1982 | Fang et al. | 357/16 |
| 4,435,898 | 3/1984 | Gaur et al. | 357/50 |
| 4,577,211 | 3/1986 | Bynum et al. | 357/34 |
| 4,825,275 | 4/1989 | Tomassetti | 357/48 |

FOREIGN PATENT DOCUMENTS 56-7525  1/1981  Japan .

Primary Examiner—William D. Larkins
Attorney, Agent, or Firm—Jeffrey L. Brandt; Harold Huberfeld

[57] ABSTRACT

A circuit for generating a negative voltage includes: a bipolar transistor including, a) an N type collector region, b) a P type base region, and c) an N type emitter region, the base region width between the emitter region and the collector region being less than about 5,000 angstroms and the dopant concentration of the base region being in the range of about $1–10 \times 10^{18}$ atoms/cm$^3$; means for applying a reference potential to the base region; and means for applying a bias potential to the emitter region so as to generate a negative output potential at the collector region. The circuit can likewise comprise a PNP bipolar transistor biased to generate a negative voltage. The circuit can be used on integrated circuit chips to provide a complementary voltage, thereby obviating the requirement for separate, complementary power supplies.

2 Claims, 2 Drawing Sheets

BIPOLAR TRANSISTOR USING EMITTER-BASE REVERSE BIAS CARRIER GENERATION

The present invention relates generally to electronic circuits, and more specifically to a voltage generator particularly suited for generating a complementary voltage.

BACKGROUND OF THE INVENTION

In many types of electronic circuit applications, it is necessary to provide at least two power supplies: a positive voltage power supply and a negative voltage power supply. In BiCMOS circuits, for example, it is typically necessary to provide both positive and negative bias voltages for providing power to the various circuit elements.

The use of two power supplies is expensive both in terms of the power supplies themselves, and the layout and formation of the voltage distribution lines necessary to distribute the two voltages. This layout and distribution requires not only substantial planning and design, but a significant percentage of available wiring.

OBJECTS OF THE INVENTION

An object of the present invention is to provide a voltage generator circuit responsive to a positive voltage for generating a negative voltage.

Another object of the present invention is to provide such a circuit which can be formed on a single semiconductor chip.

A further object of the present invention is to provide such a circuit which can be formed from a single transistor.

Yet another object of the present invention is to provide such a circuit which can be used to bias the substrate of a semiconductor chip.

Yet a further object of the present invention is to provide such a circuit which can be used to level-shift a voltage.

Another object of the present invention is to provide a method of operating a bipolar transistor, responsive to a voltage of a first polarity, so as to generate a voltage of a second polarity.

Yet another object of the present invention is to provide such a circuit and method capable of generating a high-speed switching pulse for switching controlled transistors.

SUMMARY OF THE INVENTION

In accordance with the present invention, there is provided a circuit comprising: a bipolar transistor including, a) an N type collector region, b) a P type base region, and c) an N type emitter region; means for applying a reference potential to the base region; and means for applying a bias potential to the emitter region so as to generate a negative output potential at the collector region.

In accordance with another aspect of the present invention, there is provided a method of operating a bipolar transistor to generate a voltage, the bipolar transistor including, a) an N type collector region, b) a P type base region, and c) an N type emitter region, the method comprising the steps of: applying a reference potential to the base region; and applying a bias potential to the emitter region so as to generate a negative output potential at the collector region.

DESCRIPTION OF THE DRAWING FIGURES

These and other objects, features, and advantages of the present invention will be understood from a consideration of the detailed description of the invention set out below, with reference to the drawing Figures, in which.

DETAILED DESCRIPTION OF THE INVENTION

Figure 1:
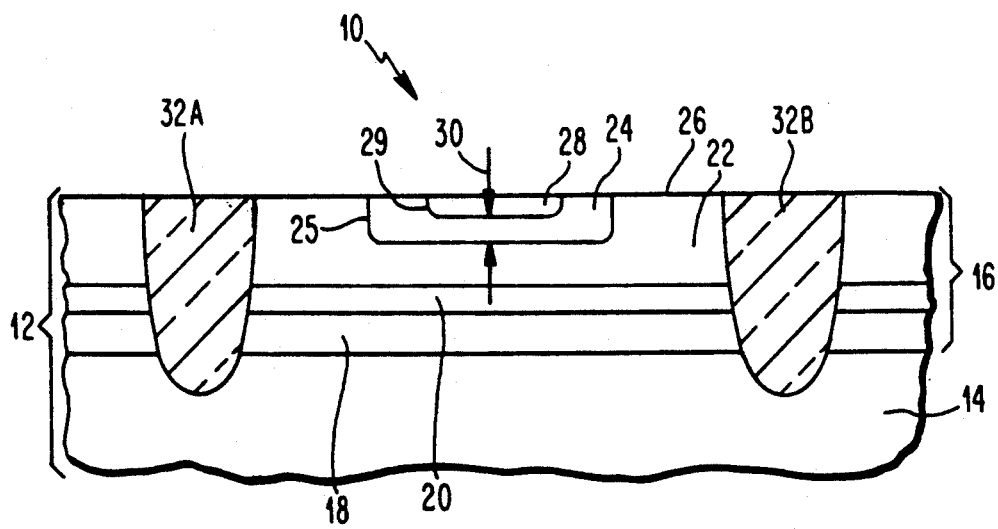
FIG. 1 shows a cross-sectional view of a vertical bipolar transistor constructed in accordance with the present invention.

Referring now to the drawings, FIG. 1 shows a vertical bipolar transistor 10, fabricated in accordance with the present invention, in an electrically isolated region of a silicon semiconductor chip 12.

Chip 12 comprises a P conductivity type substrate 14 having, for example, a <100> crystallographic orientation and a resistivity of about 0.01 ohm-cm. An epitaxial region 16 on substrate 14 includes a P- layer 18, an overlying N+layer 20, and an overlying N collector layer 22. Collector layer 22 is formed so as to have a doping concentration in the range of $1-10\times10^{16}$ atoms/cm$^3$.

As used herein, "P" and "N" denote dopant conductivity types, while "+" and "−" are used as appropriate to designate relative doping concentrations.

A P base region 24 extends from a surface 26 of collector layer 22 into the collector layer. Base region 24 is contained entirely within collector layer 22, defining a base-collector junction 25 therewith. Similarly, an N emitter region 28 extends from surface 26 into base region 24, and is entirely contained within the base region, defining a base-emitter junction 29 therewith. Base region 24 is formed so as to have a doping concentration in the range of $1-10\times10^{18}$ atoms/cm$^3$ proximate base-emitter junction 29. Emitter region 28 is formed so as to have a doping concentration in the range of $1-10\times10^{20}$ atoms/cm$^3$.

In accordance with the present invention, emitter region 28 and base region 24 are formed such that the typical width 30 of the base region, that is, the distance between junctions 25 and 29, is equal to or less than about 5,000 angstroms. As is discussed in further detail below, when it is desired to operate the transistor in a switching manner, the base width 30 is desirably formed to be equal to or less than about 3,000 angstroms. Otherwise, there is no inherent upper boundary on width 30, 5,000 angstroms comprising a practical dimension for a high-performance transistor of this type.

Electrically isolating trench regions 32A, 32B extend from surface 26 downward into substrate 14, electrically isolating transistor 10 from other devices (not shown) on chip 12. Isolating trenches 32A, 32B are lined with an insulator, for example silicon dioxide, and filled with polysilicon or another insulating material in a conventional manner.

Many methods are known in the art for forming transistor 10 as shown in FIG. 1. For example, and without limitation, one such process is as follows:

1) substrate 14 is provided from a conventional crystal melt;
2) layer 18 is grown epitaxially, by a CVD process, over substrate 14;
3) the surface of layer 18 is doped heavily N+, and an N− layer is grown epitaxially thereover to provide layers 20 and 22;
4) isolation trenches 32A and 32B are etched, filled, and planarized;
5) base region 24 is deposited into layer 22, preferably by a well-controlled process such as ion implantation or out-diffusion from a solid doping source; and
6) emitter region 28 is deposited into region 24, again preferably by a well-controlled process, such as ion implantation or out-diffusion from a solid doping source.

The processes of forming base region 24 and emitter region 28 are carefully controlled, as described in steps #5 and #6 above, so that the base width 30 and the base doping concentration are in accordance with the ranges set out below.

Figure 2:
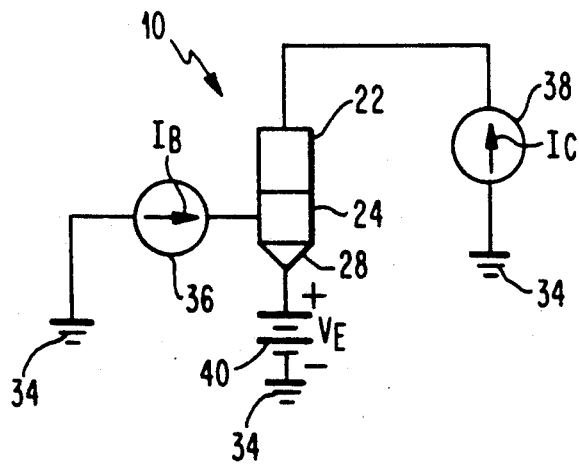
FIG. 2 shows a schematic view of the transistor of FIG. 1 operated in accordance with the present invention and connected to ammeters for purposes of explaining this operation.

Referring now to FIG. 2, base region 24 is connected to a reference potential, in this case a ground potential 34, through an ammeter 36 for measuring base current $I_B$. Collector region 22 is likewise connected to ground 34 through an ammeter 38 for measuring collector current $I_C$. Emitter region 28 is biased to a positive potential $V_E$, using a dc power supply 40, with respect to ground 34.

The present inventors have discovered that, when vertical bipolar transistor 10 having base region 24 with a thickness of about 5,000 angstroms and a doping concentration in the range of $1$–$10 \times 10^{18}$ atoms/cm$^3$, has its emitter region 28 biased positively with respect to its base region 24, then, unexpectedly, a positive collector current $I_C$ flows into collector region 22.

The present inventors theorize that the positive component of the collector current $I_C$, termed herein $I_C'$, is caused by electrons flowing out from the collector, these electrons being created by impact ionization by high energy holes, the holes in turn being created by high fields in the emitter-base junction, constituting a hole current $I_h$. $I_C'$ is positive, i.e. electrons are leaving collector region 22 and flowing toward ammeter 38. It is to be noted that the magnitude of the ratio $I_C/I_h$ is determined mainly by the energy band-gaps of the emitter and base regions 28, 24, respectively, and by the dopant concentration profiles of the emitter and base regions.

As voltage $V_E$ is further increased, it eventually causes base region 24 to approach depletion (commonly referred to as punch-through). This depletion gives rise to thermionic emission of electrons from collector region 22 into emitter region 28 through base width 30. This component of the collector current will be termed herein $I_C''$, and is negative, i.e. comprising electrons flowing into collector region 22 from the external circuit. Thus collector current $I_C = I_C' + I_C''$, and $I_C$ will go from positive to negative as $V_E$ is increased towards the punch-through voltage described above.

It will be appreciated that it is not necessary to understand the theory of the present invention, its operation being otherwise thoroughly described herein.

Figure 3:
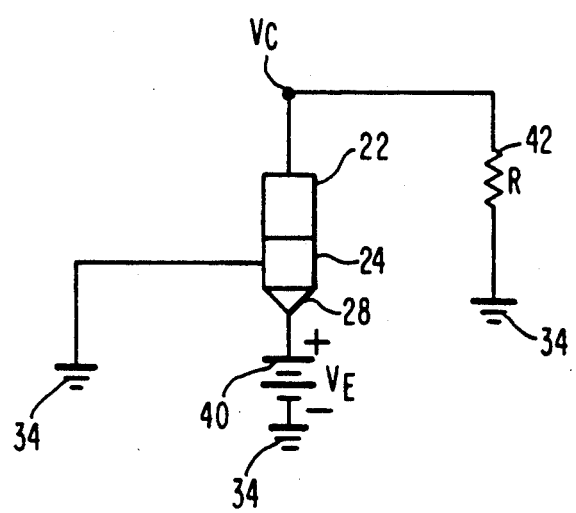
FIG. 3 shows a schematic view of the transistor of FIG. 1 connected to a resistive load and operated in accordance with the present invention.
Figure 4:
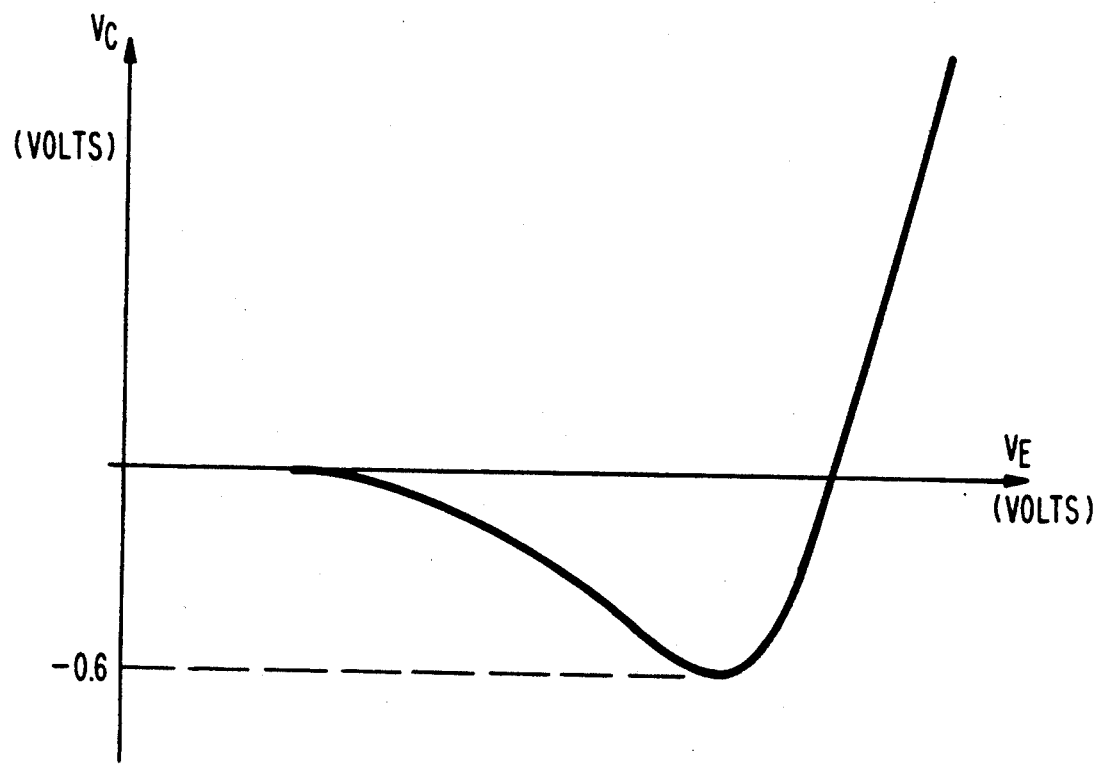
FIG. 4 is a graph showing a plot of the collector versus emitter voltages (i.e. $V_C$ vs. $V_E$) for the circuit of FIG. 3.

Referring now to FIGS. 3 and 4, for purposes of further illustrating the present invention, FIG. 3 shows the same circuit as FIG. 2 with ammeters 36 and 38 removed, and with the addition of a resistive load 42 between collector region 22 and ground 34. As shown in FIG. 4, when emitter region 28 is biased positively with respect to base region 24, i.e. by increasing $V_E$, a negative voltage $V_C$ is developed at the terminal where load 42 connects to collector region 22. Voltage $V_C$ goes negative because, for lower values of $V_E$, current component $I_C'$ $\pi$ ($I_C''$) absolute value. Hence, collector current $I_C$ flows from ground, through resistor 42, into collector region 22.

The present inventors have determined that the maximum negative potential for $V_C$ is nearly equal to, but not exceeding, the potential across base-collector junction 25, or one diode drop of approximately 0.6 volts. When $V_E$ is set above the bias potential necessary to generate this maximum negative $V_C$, for relatively narrow base region 24, collector current $I_C$ will reverse its polarity as the absolute value of current component $I_C''$ exceeds the value of current component $I_C'$, and $V_C$ goes to a positive voltage. The exact relationship between voltages $V_E$ and $V_C$ varies as a function of the doping concentration of base and emitter regions 24, and 28, respectively, and the width 30 of base region 24, in a manner described in further detail hereinbelow.

Considering FIG. 1 in light of FIGS. 3 and 4, it will be appreciated that, when a positive voltage is applied to emitter region 28, and base region 24 is grounded, then collector region 22 will be biased to approximately −0.6 v (i.e. the circuit of FIG. 3 with the resistor R connected to the collector region 22). This will in turn forward bias the substrate-collector junction (i.e. the junction between regions 18 and 20), providing a path for holes injected into the substrate to be drawn off. Thus, when a ground-up power supply is utilized to provide a positive voltage for semiconductor chip 12, the present invention can be utilized to hold substrate 14 at approximately the most negative supply voltage, i.e. ground, without providing a separate ohmic contact to the substrate. This significantly reduces process and structure complexity and cost.

With reference to FIG. 4, it will be noted that collector voltage $V_C$ experiences a transition from negative-to-positive voltage, i.e. a current reversal, or a change in voltage polarity. The present invention can thus be used for applications requiring such a polarity change, for example to switch a bipolar or FET transistor between "on" and "off" modes of operation. While general ranges have been set out for the width 30 and dopant concentration of base region 24, the present inventors have discovered that, to effect the current reversal (change in voltage polarity) shown in FIG. 4, it is necessary to maintain a relatively low base width 30 and high base dopant concentration. For example, it has been determined that the current reversal will occur for base widths 30 of less than about 3,000 Angstroms, and a base region 24 dopant concentration of in the range of $2$–$4 \times 10^{18}$ atoms/cm$_3$. In general, a current reversal can be obtained with a base width of less than about 5,000 Angstroms, in combination with an appropriately high base dopant concentration.

If no current reversal is desired, then there are few, practical limitations on the upper limit of base width 30.

One such limitation is the diminishing amplitude of $I_C'$ with increasing base width 30, caused by increased electron-hole recombination in the neutral portion of the base region 30. Another such practical limitation is the incompatibility of processing selected transistors with wide base regions on VLSI or ULSI chips on which most of the transistors are of narrow base width.

In another application, the present invention can be used as an on-chip voltage generator whenever a positive supply voltage is available and a negative supply voltage is required. Thus, only one, positive power supply will need to be provided off-chip, and the interconnect and distribution wiring for the on-chip generated negative supply voltage will be substantially simplified.

Figure 5:
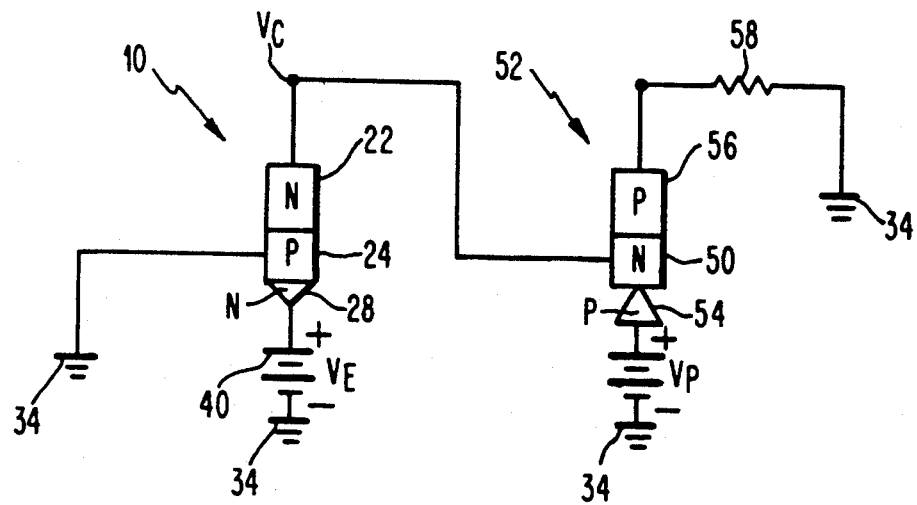
FIG. 5 is a schematic view of the transistor of FIG. 1 connected with a PNP transistor whereby to level shift the voltage reference of the PNP transistor.

Referring now to FIG. 5, in yet another application of the present invention, voltage $V_C$ at collector region 22 is applied to the N type base region 50 of a PNP transistor 52. Transistor 52 further includes a P type emitter region 54 connected to ground 34 through a positive voltage source $V_P$, and a p type collector region 56 connected to ground 34 through a load resistor 58. The present invention is thus used to shift the voltage reference of transistor 52. The present invention can likewise be connected to the gate of an FET device (not shown) to achieve a similar effect.

While the present invention has been described above with respect to a vertical NPN transistor, it will be understood that it is equally applicable to PNP transistors, and to lateral transistor structures, with appropriate adjustments of the reference and bias potentials. More specifically, when transistor 10 comprises a PNP transistor, $V_E$ is selected to bias emitter region 28 negatively with respect to reference potential 34. Bias voltage $V_E$ is thus adjusted in a manner analogous to that described above to provide a more positive voltage at collector region 22.

There is thus described a voltage generator circuit for generating a negative, or negatively shifted, output voltage, responsive to a positive input or bias voltage. This voltage generator circuit is implemented with a single, vertical bipolar transistor, and is readily incorporated on a semiconductor chip. The circuit has many uses, including the biasing of a semiconductor chip substrate, as well as the provision of a complementary voltage supply as may be required for other circuit elements on the same chip.

The present invention has application in the manufacture and operation of semiconductor chips, and, because of its compact and efficient nature, is particularly useful in very- large scale and ultra-large scale integrated (VLSI and ULSI) circuits.

While the invention has been described with respect to preferred embodiments, it is not thus limited. Numerous modifications, changes, and improvements will occur to those skilled in the art which fall within the spirit and scope of the invention.

What is claimed is:

1. A circuit comprising:
   a bipolar transistor including,
     a) an N type collector region,
     b) a P type base region, and
     c) an N type emitter region;
   the base region width between said emitter region and said collector region being less than about 5,000 angstroms, and the dopant concentration of said base region being in the range of about $1-10 \times 10^{18}$ atoms/cm$_3$;
   means for applying a ground reference potential to said base region; and
   means for applying a bias potential to said emitter region, said bias potential being positive with respect to said ground reference potential, so as to generate an output potential at said collector region, said output potential being negative with respect to said ground reference potential.

2. A circuit comprising:
   a bipolar transistor including,
     a) a P type collector region,
     b) an N type base region, and
     c) a P type emitter region,
   the base region width between said emitter region and said collector region being less than about 5,000 angstroms, and the dopant concentration of said base region being in the range of about $1-10 \times 10^{18}$ atoms/cm$^3$;
   means for applying a ground reference potential to said base region; and
   means for applying a bias potential to said emitter region, said bias potential being negative with respect to said ground reference potential so as to generate an output potential at said collector region, said output potential being positive with respect to said ground reference potential.

* * * * *